(12) United States Patent
Eckblad et al.

(10) Patent No.: US 6,350,136 B1
(45) Date of Patent: Feb. 26, 2002

(54) METHOD AND APPARATUS FOR A PIN CLAMP

(75) Inventors: Michael Z. Eckblad, Auburn, WA (US); James G. Maveety, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/211,985

(22) Filed: Dec. 14, 1998

(51) Int. Cl.$^7$ ................................ H01R 13/15
(52) U.S. Cl. ........................ 439/259; 439/264
(58) Field of Search ................... 439/259, 260, 439/261, 262, 263, 264, 265, 68, 69, 70, 72, 73, 330, 353, 525, 526, 775, 816, 886, 887, 331, 848, 342

(56) References Cited

U.S. PATENT DOCUMENTS

| | | | | |
|---|---|---|---|---|
| 3,683,317 A | * | 8/1972 | Walkup | 439/264 |
| 3,923,361 A | * | 12/1975 | Rosen | 439/264 |
| 5,442,145 A | * | 8/1995 | Imai et al. | 174/267 |

* cited by examiner

*Primary Examiner*—Gary Paumen
*Assistant Examiner*—Ross Gushi
(74) *Attorney, Agent, or Firm*—Blakely, Sokoloff, Taylor & Zafman LLP

(57) ABSTRACT

A socket comprising an electrically conductive element, the element situated within a well such that a first end of the element extends above a first surface of the socket, the element capable of flexing to exert a first force on a pin inserted into the well upon application of a second force by a descending surface to the first end of the element.

13 Claims, 4 Drawing Sheets

METHOD AND APPARATUS FOR A PIN CLAMP

BACKGROUND

1. Field

The present invention relates to pin sockets and, more particularly, to zero force insertion and extraction pin sockets.

2. Background Information

Current integrated circuit (IC) package configurations include a large number of pins by which electrical signals are transmitted to and from the circuits in the package. Pins are typically constructed of thin strips of copper, gold, or other electrical conductors which protrude from the IC package and which are typically connected to other, external circuits using solder joints. As ICs increase in complexity, the number of pins comprised by IC packages also increases. A collection of package pins is sometimes called a pin grid array (PGA).

IC packages are often coupled to circuits external to the IC using sockets. Sockets are mechanical couplers that are typically soldered directly in external circuits and which provide an electrical connection to the external circuit for IC packages which are inserted into the sockets. Sockets offer advantages over direct solder connections between ICs and the external circuits. For example, an IC package which is mounted in a socket can be installed and removed numerous times from the external circuit without soldering and unsoldering the package pins.

As the number of pins comprised by IC packages increases, it typically becomes more difficult to insert and remove the package pins from an associated socket because of the resistance encountered by the pins as they descent into the socket. Each pin may make electrical contact with a conductor in an associated socket pin receiver, the conductor in electrical contact with the external circuit. Electrical coupling between package pin and socket pin receiver conductor is typically accomplished through contact between the conductor in the socket receiver and the inserted pin. While the insertion and extraction resistance associated with contact to a single package pin is not substantial, for packages with large PGAs (sometimes on the order of hundreds of pins) the accumulated resistance may become an impediment to easy insertion and removal of the package pins into and out of the socket. The accumulated force may be so substantial that insertion of the package pins into the socket may result in damage to the package pins.

FIG. 1 shows an embodiment of a prior art socket 100 to alleviate resistance to insertion and removal of a pin 160 into a well 170 in a socket body 110. Sockets for this purpose are typically called zero insertion force (ZIF) sockets. Before the pin 160 descends into the well 170, a normal force Fx is applied to the head of an electrically conductive element 150. The normal force Fx is typically applied using a member 120 coupled to a mechanical cam/lever assembly (not shown). The normal force Fx causes the element 150 to flex in a manner which provides the descending pin 160 an unobstructed path down into the well 170. This unobstructed path reduces the amount of downward force Fz to be applied to insert the pin 160 to nearly zero. Once the pin 160 is inserted in the well 170, the lever is operated to return the member 120 to a position that returns element 150 to a position in which it makes electrical contact with the pin 160. In this position the element 150 exerts a normal force against the pin 160 to retain the pin 160 in the well 170 and create an electrical connection. The element 150 may descend through a bottom 130 of the socket body 110 and terminate in an end 140 which is capable of being soldered to an external circuit.

Several disadvantages are associated with the prior art socket embodiment shown in FIG. 1. The socket may be complex and relatively costly to manufacture because of the additional parts and connections employed by the cam/lever action to flex the element 150. It is typically difficult, for example, to manufacture such sockets as single-piece units. More parts require more material and commensurate more weight and expense. Because a lever action is used, clamping a pin may employ as many as three distinct motions—actuation of the lever to flex the element 150, insertion of the pin 160 and reverse actuation of the lever to unflex the element 150. Furthermore, variation of the normal force applied by the element 150 against the pin 160 cannot easily be accomplished without redesigning the shape and position of the element 150 and/or the dimensions of the well 170.

SUMMARY

A socket includes an electrically conductive element situated within a well. The element is situated such that a first end of the element extends above a first surface of the socket. The element is capable of flexing to exert a force on a pin inserted into the well upon application of a force to the first end of the element by a descending surface.

BRIEF DESCRIPTION OF THE DRAWINGS

The subject matter regarded as the invention is particularly pointed out and distinctly claimed in the concluding portion of the specification. The invention, however, may be further understood by reference to the following detailed description read with reference to the accompanying drawings.

DETAILED DESCRIPTION

The present invention comprises an embodiment of a socket and/or components thereof, including methods and apparatus' that may be employed to implement such embodiments. The embodiments described herein enable a socket with several advantages over existing implementations. For example, some embodiments may be implemented using fewer parts than prior art implementations employing cams and/or levers. The embodiments described herein are merely illustrative, and one skilled in the art will appreciate that numerous modifications can be made which nonetheless fall within the scope of the present invention.

Figure 2:
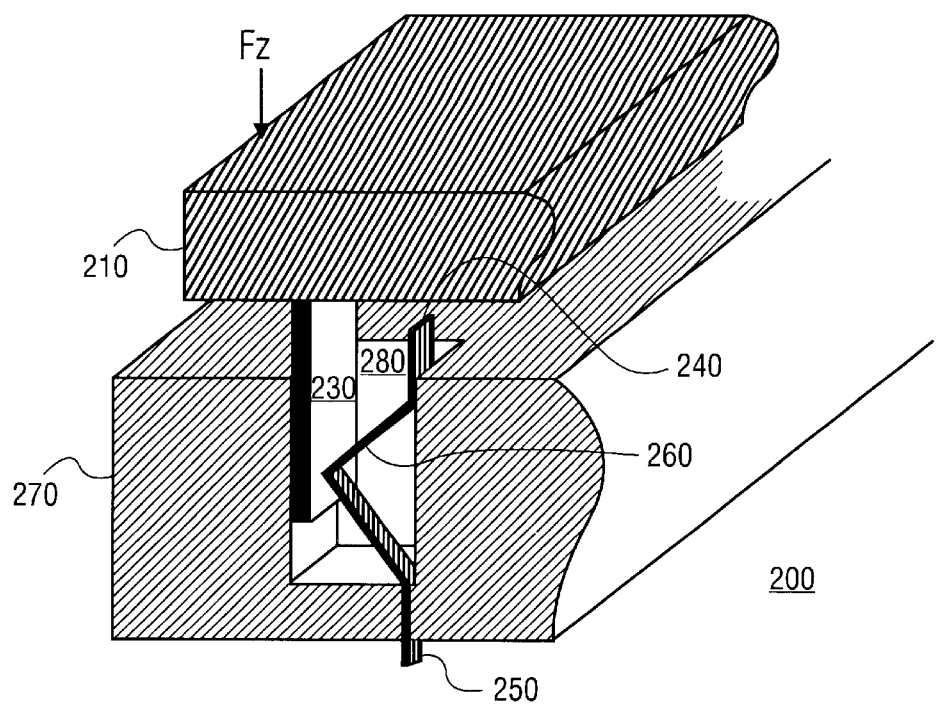
FIG. 2 is a cutaway illustration of an embodiment of a socket in accordance with the present invention showing an electrically conductive element in an unflexed position.

FIG. 2 is a cutaway illustration of an embodiment 200 of a socket in accordance with the present invention showing an electrically conductive element 260 in an unflexed position. The element 260 is situated inside a well 280 within a socket body 270 and is in contact with the socket body 270 at a lower end 250. The lower end 250 may protrude beyond the socket body 270 is order to provide a solder point for coupling the element 260 to an external circuit. An upper end 240 of the element 260 may slide along a wall of the well 280. A circuit package 210 is shown descending toward the socket body 270 with a force Fz. A pin 230 protruding from the package 210 descends into the well 280 without making contact with the unflexed element 260. Because there is limited or no contact between the pin 230 and the element 260, the force Fz is low. Of course, the figure merely illustrates the invention in one embodiment.

Figure 3:
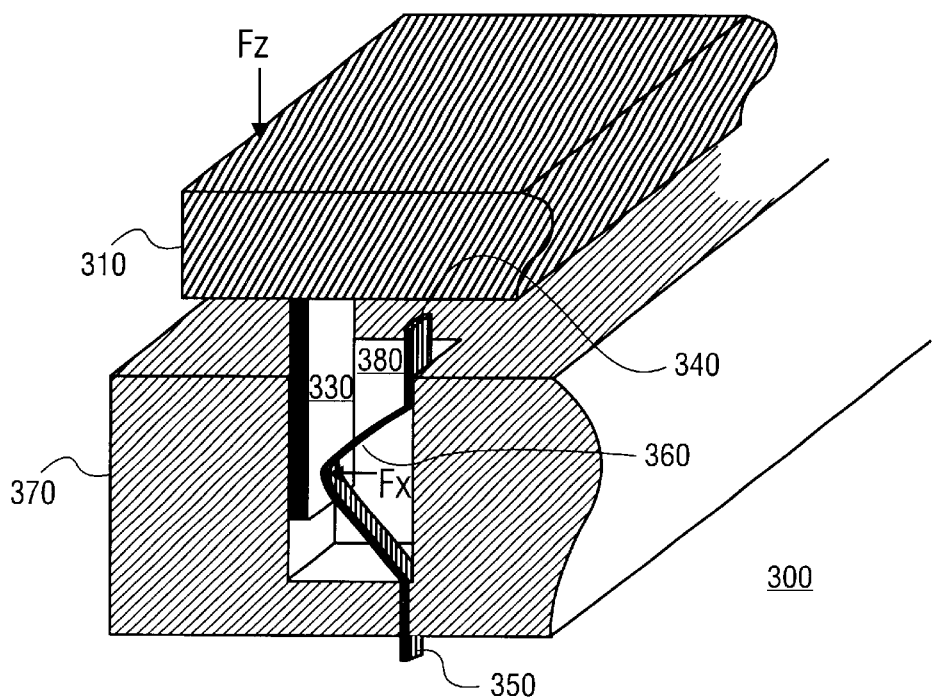
FIG. 3 is a cutaway illustration of an embodiment of a socket in accordance with the present invention showing an electrically conductive element in a flexed position.

FIG. 3 is a cutaway illustration of an embodiment 300 of a socket in accordance with the present invention showing an electrically conductive element in a flexed position. The bottom surface of the package 310 has made contact with the top end 340 of the element 360 and continues to descend toward the socket body 370. In this embodiment, the top end 340 of the element 360 slides down the wall of the well 380, causing the element 360 to flex in a direction approximately normal to the direction of descent with a force Fx. This flexation of the element 360 results in the element 360 increasing the force of contact with the descending pin 330. The resistance generated by contact with the top end 340 of the element 360 results in an increase in the force Fz. Electrons may be conducted from the circuit inside the package 310 to an external circuit coupled to the lower end 350 of the element 360. The force Fx results in securing the pin 330 within the well 380.

In another embodiment, the surface making contact with the top end 340 of the element 360 may not be the bottom surface of the package 310, but may instead be the surface of a plate separate from the package 310. Those skilled in the art will appreciate that flexation of the pin 330 may result from contact with any descending surface (for example the lower surface of a z-axis lever actuation plate). Those skilled in the art will also appreciate that fixing the contact surface while raising the socket body 370 would comprise an equivalent motion to descending the contact surface.

Other embodiments may provide a degree of wipe contact (low-normal force sliding contact) between the pin 330 and the element 360 during descent of the pin 330. Wipe contact may be limited to maintain a low insertion force while at the same time providing for some abrasion of the pin 330 surface to clean the pin 330 surface to provide better electrical properties.

Different types of materials may be employed for the pin 230 and the element 260. In one embodiment, the pin 230 and element 260 comprise copper or copper beryllium coated with nickel and then gold to provide sufficient electrical conductivity along with mechanical strength. The nickel and gold reduce oxidation of the copper core. The force Fz employed to flex the element 360 is a function of the curvature of the element 360 and the thickness of the element 360, among other factors. These factors may also affect the impedance generated in the pin-element junction. Different applications may employ different permutations of these factors to adjust the force Fz to improved values for the particular application. In one embodiment involving a package comprising 418 pins, a maximum force for inserting all pins of the package into a socket is approximately 15 pounds. In this embodiment, each pin 330 is approximately 18 mil (¹⁄₁₀₀₀ inch) across, with a round or flat cross section, and the element 360 is approximately 9–10 mil across, with a flat cross section.

The unflexed shape of the element 360 is illustrated as an equilateral triangle in the embodiment of FIG. 2, although the invention is not limited in this regard. Upon flexation, the element 360 takes on a more curved shape, but in some embodiments may maintain an abrupt angle at the point of contact with the pin 330 to provide improved contact with the surface of the pin 330.

The top end 340 of the element 360 will, in one embodiment, slide approximately 20–30 mil units along the face of the well 380 to produce a sufficient flexation in the element 360. In this embodiment, the well 380 has an approximate depth of 110 mil and the initial point of contact between the element 360 and the pin 330 occurs at approximately 40 mil below the top surface of the socket body 370. The flexation of the pin 330 and the normal force Fx may be varied by adjusting the height of the top end 340 of the element 360 above the top surface of the socket body 370, which permits design flexibility in both the amount of normal force Fx applied and also the thickness of the pin 330. Typically, the greater the height of the top end 340 of the element 360 above the surface of the socket body 370, the greater the potential normal force Fx which may result because of the greater potential flexation of the element 360. Variable flexation of the element 330 may also provide for the use of pins 330 of different thickness' without adjustment to the width of the well 380.

The socket body 370 may be comprised of any material capable of sustaining the normal forced generated by insertion of the pin 330 into the well 380. In one embodiment, the socket body 370 may be constructed from liquid crystal polymer (LCP). In another embodiment, the socket body 370 may be comprised of the compound FR4, well known in the art for constructing printed circuit boards (PCB). Using FR4 may be desirable when the external circuit to which the socket is coupled in a PCB, providing the same expansion coefficients between socket and the PCB to which it is mounted.

Figure 4:
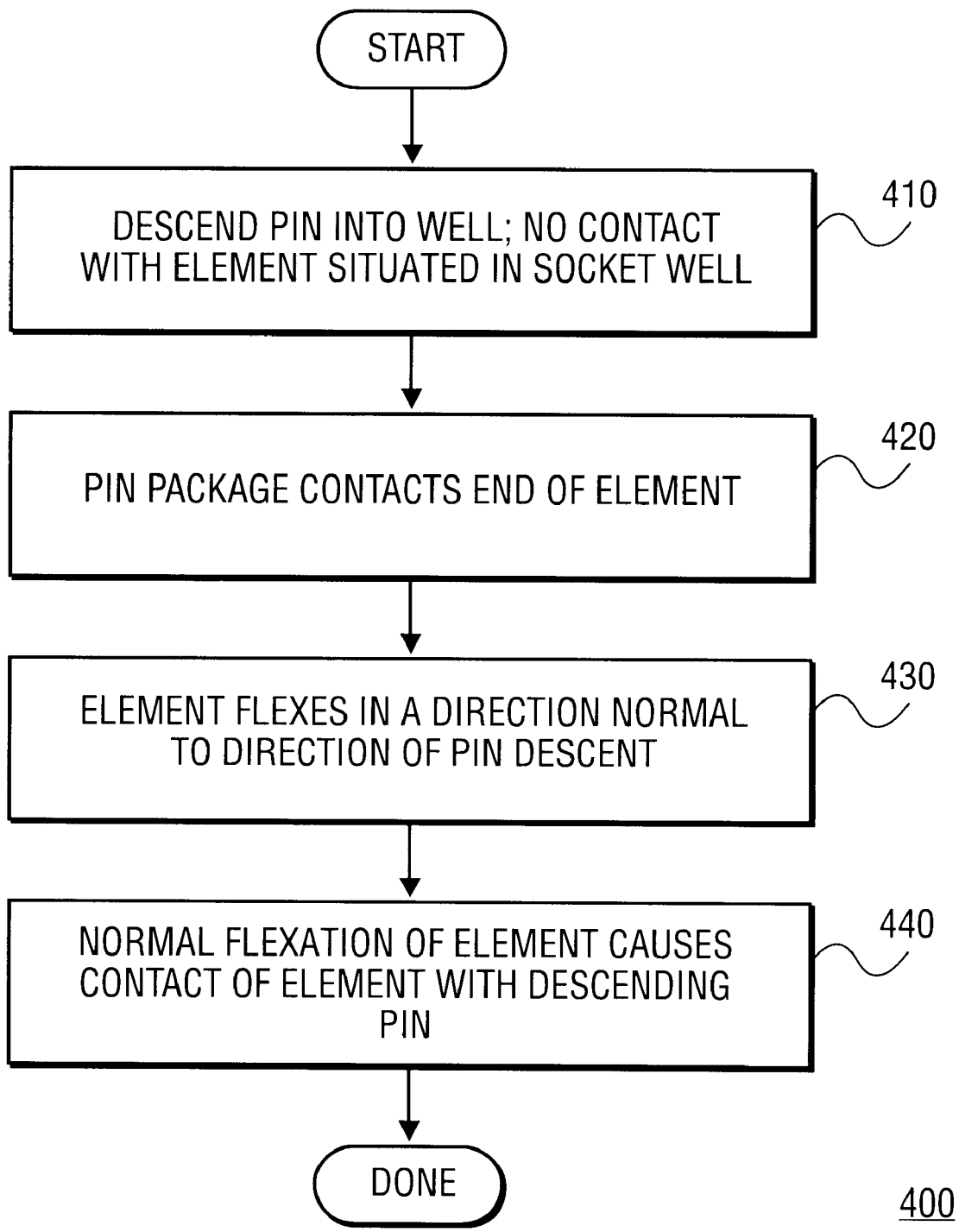
FIG. 4 is a flowchart illustrating one embodiment of a method to secure a pin within a socket in accordance with the present invention.

FIG. 4 is a flowchart illustrating one embodiment 400 of a method to secure a pin within a socket in accordance with the present invention. At 410 a pin with is part of a pin package is descended into a well with minimal or no contact with an element situated within the well. The pin package or other surface contacts the end of the element at 420, and at 430 the element flexes in a direction normal to the direction of pin descent. The normal flexation of the element results in contact of the element with the descending pin at 440. Electrons may then flow from a circuit within the package through the pin to an external circuit coupled to the element.

Figure 1:
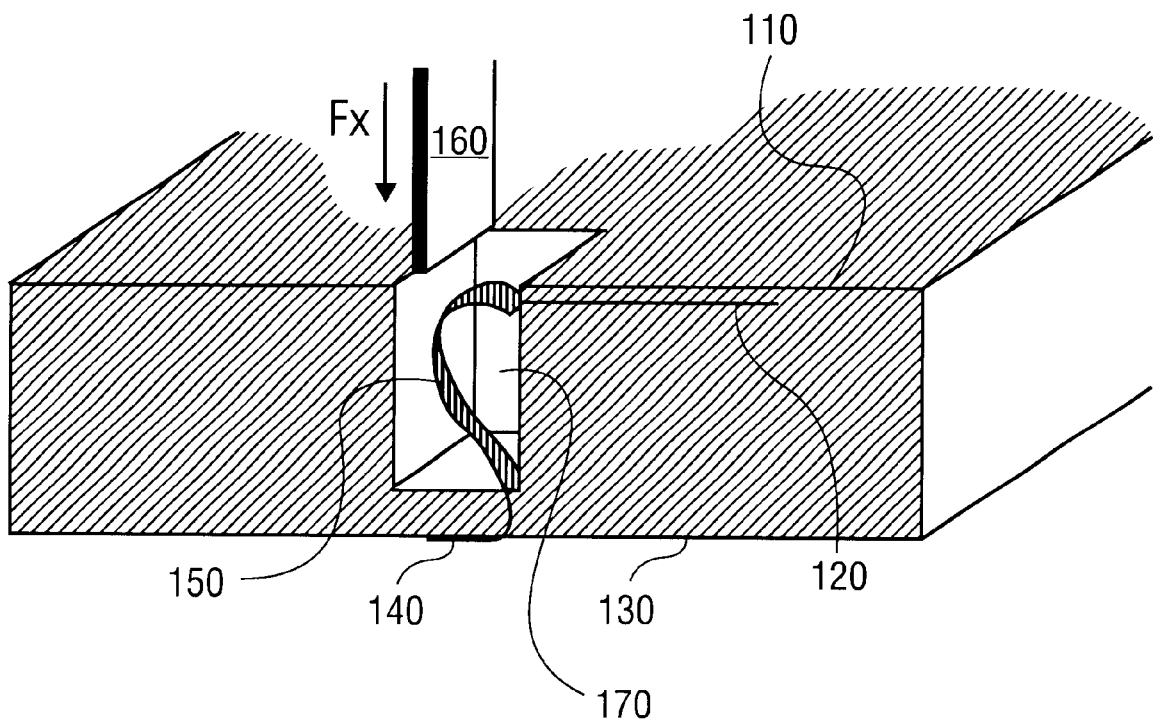
FIG. 1 is a cutaway illustration of a prior art embodiment of a ZIF socket.
Figure 5:
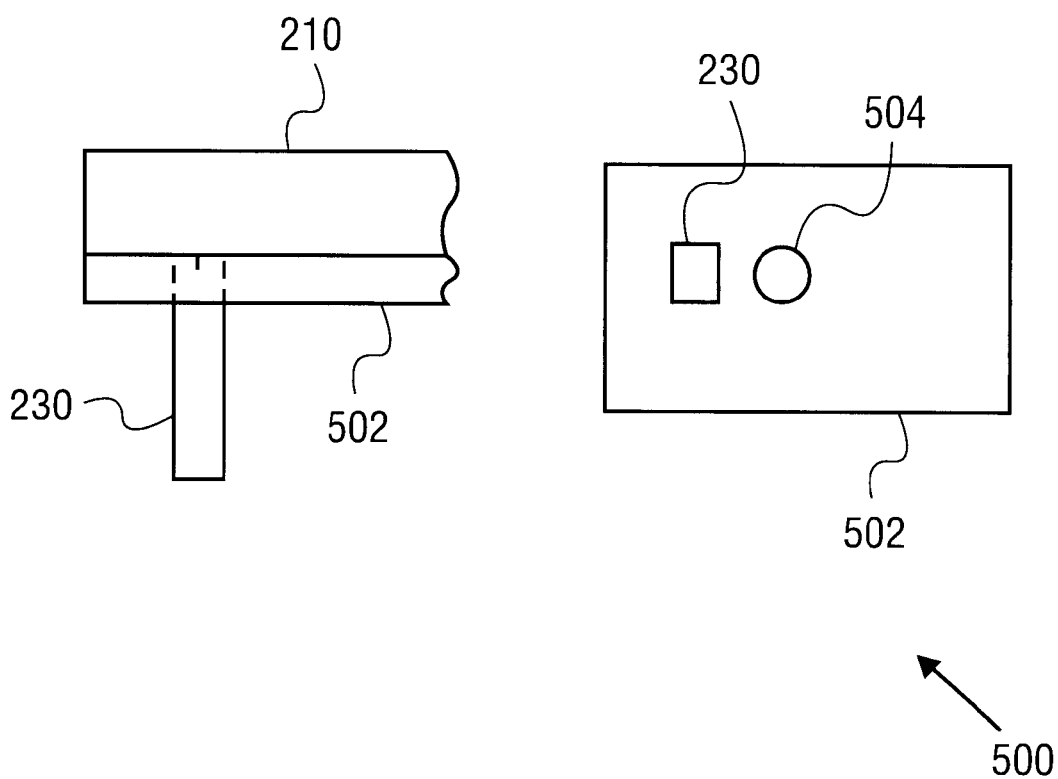
FIG. 5 shows an embodiment of an actuator plate with a depression in accordance with the present invention.

The pin, package, and element may comprise but are not limited to any of the possible embodiments described with respect to FIG. 1. For example, in one embodiment the pin and element comprise a copper core coated with nickel and then gold. To prevent lateral motion of the end of the element across the surface of the package, the descending surface may include depressions which the end of the element enters and which help reduce lateral motion. An embodiment 500 of an actuator plate 502 with a depression 504 is shown in FIG. 5. The plate 502 is adapted such that depression 504 is aligned to make contact with top end 340 of element 360 as the surface descends.

Sockets implemented in accordance with the present invention offer several advantages. Sockets implemented in accordance with the present invention may be constructed without cam/lever assemblies for actuation, which may be less complex and less costly to manufacture because of there may be fewer parts and connections required. Less parts require less material and commensurate less weight and expense. Because no lever action is used, clamping a pin requires only a single motion—descent of the pin 330 into the well 380. Furthermore, variation of the normal force applied by the element 360 against the pin 330 can be accomplished by variation of the thickness of the element 360, among other factors.

In summary, embodiments of an advantageous method and apparatus to actuate clamping of a pin in a socket have been disclosed. In one embodiment, contact between a descending surface and an element situated in a socket well causes the element to flex in a direction normal to the direction of descent. The flexed element makes contact with a pin coupled to a pin package as the pin descends into the well. Electrical contact is created between the circuit in the package through the pin to the element.

While certain features of the invention have been illustrated as described herein, many modifications, substitutions, changes and equivalents will now occur to those skilled in the art. It is, therefore, to be understood that the appended claims are intended to cover all such embodiments and changes as fall within the true spirit of the invention.

What is claimed is:

1. A socket comprising:
   an electrically conductive element situated within a well such that a first end of the element extends above a first surface of the socket, the element capable of flexing to exert a first force on a pin inserted into the well upon application of a second force by a descending surface to the first end of the element, application of the second force to the first end of the element resulting in a first section of the element sliding along a wall of the well in a direction of descent of the descending surface.

2. The socket of claim 1 in which the descending surface comprises a package surface of a package comprising the pin.

3. The socket of claim 1 in which the element is situated along a wall of the well, and the first end is detached from socket, and a second end of the element is attached to the socket.

4. The socket of claim 1 in which a second end of the element protrudes beyond a second surface of the socket.

5. The socket of claim 1 in which the element is comprised of a copper core with gold plating.

6. A socket comprising:
   a means for securing a pin within a well of the socket, the means for securing the pin comprising a conductive element flexing against the pin when a descending force is applied to a first end of the means for securing the pin by a means for applying force, application of the descending force to the first end resulting in a first section of the element sliding along a wall of the well in a direction of descent of the means for applying force.

7. The socket of claim 6 in which the means for securing the pin is capable of being soldered at a second end to an external circuit.

8. A method to clamp a pin of a circuit package comprising:
   flexing an electrically conductive element within a well of a socket by applying a descending surface to exert a first force on a first end of the element, the flexing of the element to generate a second force against the pin, the second force approximately normal to the first force and resulting in a first section of the element sliding along a wall of the well in a same direction as a direction of descent of the descending surface.

9. The method of claim 8 further comprising:
   generating the first force with a descending surface of the circuit package.

10. The method of claim 9 in which the descending surface is an approximately flat surface.

11. The method of claim 8 further comprising:
    generating the first force with a descending surface of an actuator plate.

12. The method of claim 8 further comprising:
    sliding a first section of the element along a wall of the well in response to exerting the first force.

13. The method of claim 8 further comprising
    contacting the first end of the element with a depression in a descending surface of the circuit package to generate the first force.

* * * * *